COAXIAL CABLE TRANSMISSION SYSTEM

Filed July 8, 1964

INVENTOR
LESTER T. DAVIS
BY Cushman, Darby & Cushman
ATTORNEYS

United States Patent Office 3,373,365

Patented Mar. 12, 1968

3,373,365

COAXIAL CABLE TRANSMISSION SYSTEM

Lester T. Davis, Chippewa Falls, Wis., assignor to Control Data Corporation, Minneapolis, Minn., a corporation of Minnesota Filed July 8, 1964, Ser. No. 381,040
5 Claims. (Cl. 330—53)

ABSTRACT OF THE DISCLOSURE

A coaxial cable transmission system for interconnecting circuit modules mounted on separate chassis. Transistor driver circuitry in a first module is connected to transistor receiver circuitry of a second module via a coaxial cable. The transistor driver utilizes a transformer arranged to develop opposing magnetizing forces while coupling the driver to the transmission line. More particularly, the driver circuitry utilizes a pair of interconnected transistors the outputs of which are joined to the transformer primary winding to develop equal and opposing magnetizing forces, but at different times.

This invention is directed towards a coaxial cable transmission system for interconnecting electrical components in a high speed digital computer and more particularly to a coaxial cable transmission line and driver for interconnecting transistor circuits.

Presently, modern high speed digital computers utilize transistors which are capable of switching from their saturation state to their cutoff state in nanoseconds of time. Coupled with this high speed capability, computers have a large number of electrical components and circuitry yielding systems which can process voluminous quantities of complex data in a minimum time.

As the state of the art relating to digital computers has been advanced, improved, and extended, a limitation encountered encumbering the speed of operation has been the time required for an electrical signal to traverse a wire conductor interconnecting electrical circuits. When a computer is to operate in the nanosecond range, wire lengths and timing of electrical signals become critical factors.

These critical factors have resulted in new computer packaging techniques including high speed transmission line and driving circuits which result in bringing electrical components physically in close proximity with each other to directly reduce the length of the interconnecting wires. Further, high speed transmission lines and driving circuits must be improved to provide fast switching operations while maintaining a light loading on the driving circuit.

When an electrical circuit utilizes several transistor components, all of which are physically mounted or located on a common printed circuit board, the interconnecting of the transistors in a close physical proximity does not present a problem from the transmission line viewpoint. A basic circuit or a plurality of circuits mounted on a common printed circuit board may be referred to as a module. Further, these modules may be mounted on chassis. Thus, two transmission line interconnections must be provided:

(a) Interconnections between modules on a common chassis; and
(b) Interconnections between modules on separate chassis.

This invention is directed towards a coaxial cable transmission system for interconnecting modules on separate chassis. A copending patent application Ser. No. 381,041, filed by applicant concurrently herewith, and entitled "Twisted Pair Transmission System," describes a transmission line and its associated circuitry for interconnecting modules on a common chassis.

As an example of a high speed digital computer which utilizes the above invention, see Patent 3,337,854, Seymour R. Cray et al., entitled "Multi-Processor Using the Principle of Time-Sharing."

Therefore, it is an object of this invention to provide a coaxial cable transmission system wherein a transistor circuit in one module drives the transistor circuit of another module while operating in the nanosecond time range.

It is another object of this invention to provide a coaxial cable transmission system wherein the time required for the voltage signal to traverse from one transistor module to another transistor module on a separate chassis is closely controlled, the timing control being provided by the delay characteristic of the coaxial cable transmission line.

A further object of this invention is to provide a coaxial cable transmission system wherein the driving transistor circuitry utilizes a transformer for coupling a transistor amplifier driver to a coaxial cable transmission line, including means for preventing the transformer from building up a bias magnetization under high switching rates in the nanosecond time range.

These and other objects and the entire scope of the invention will become more fully apparent when considered in light of the following detailed description of an illustrative embodiment of this invention and from the appended claims.

The illustrative embodiment may be best understood by reference to the accompanying drawings within:

Briefly, the coaxial cable transmission system comprises a driver cooperating with a transformer having a primary and a secondary winding. The primary winding is electrically connected to the first driver amplifier such that the first driver amplifier impresses a signal thereon inducing a magnetizing force therein and an electrical signal on the secondary winding. A second driver amplifier is electrically connected to the first driver amplifier and to the transformer primary winding, the second driver amplifier being electrically connected to the primary winding such that the second driver amplifier impresses a second signal thereon, inducing an equal and opposite magnetizing force therein and providing a second electrical signal on the secondary winding of opposite polarity to that of the first driver amplifier, the second driver amplifier being electrically connected to and controlled by the first driver amplifier such that the second driver amplifier operates for a predetermined time after the operation of the first driver amplifier. Each driver amplifier induces a magnetizing force within the transformer in opposite directions to prevent the transformer from building up a bias magnetizing force therein. Therefore, the magnetizing force within the transformer which is induced by the first driver amplifier is always neutralized by an equal but opposite magnetizing force induced by the second driver amplifier.

Figure 1:
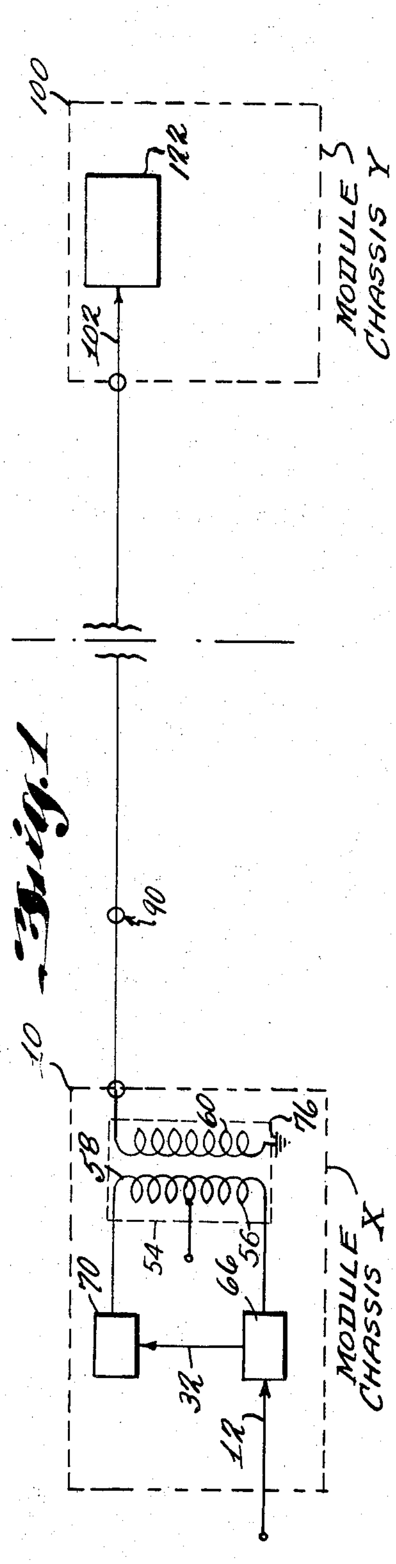
FIGURE 1 is a block diagram illustrating the use of a coaxial cable transmission system between modules on separate chassis.

FIGURE 1 illustrates via a block diagram two typical modules, module 10 and module 100 which have transistor circuits therein. Module 10 and module 100 are located on separate chassis X and Y respectively, and are interconnected by a coaxial cable transmission line 90. Module 10 on chassis X has a typical transistor driving circuit comprising two transistors illustrated by arrows 12 and 32. Transistor 12 is connected to transistor 32 and to one half of a center tapped primary winding 56 of transformer 54 via a connecting point 66. Transistor 32 is connected to the other half of a center tapped primary winding 58 of transformer 54 via a connecting line 70. The secondary winding 60 of transformer 54 has one end connected to ground 76 and its other end connected to the coaxial cable transmission line 90. Coaxial cable transmission line 90 terminates on module 100 in chassis Y. Module 100 has a typical transistor receiver illustrated by arrow 102. Transistor 102 is connected to a collector resistance illustrated by a square 122. An output from module 100 (not shown) would be connected to subsequent transistor circuits similar to that contained in module 10.

Figure 2:
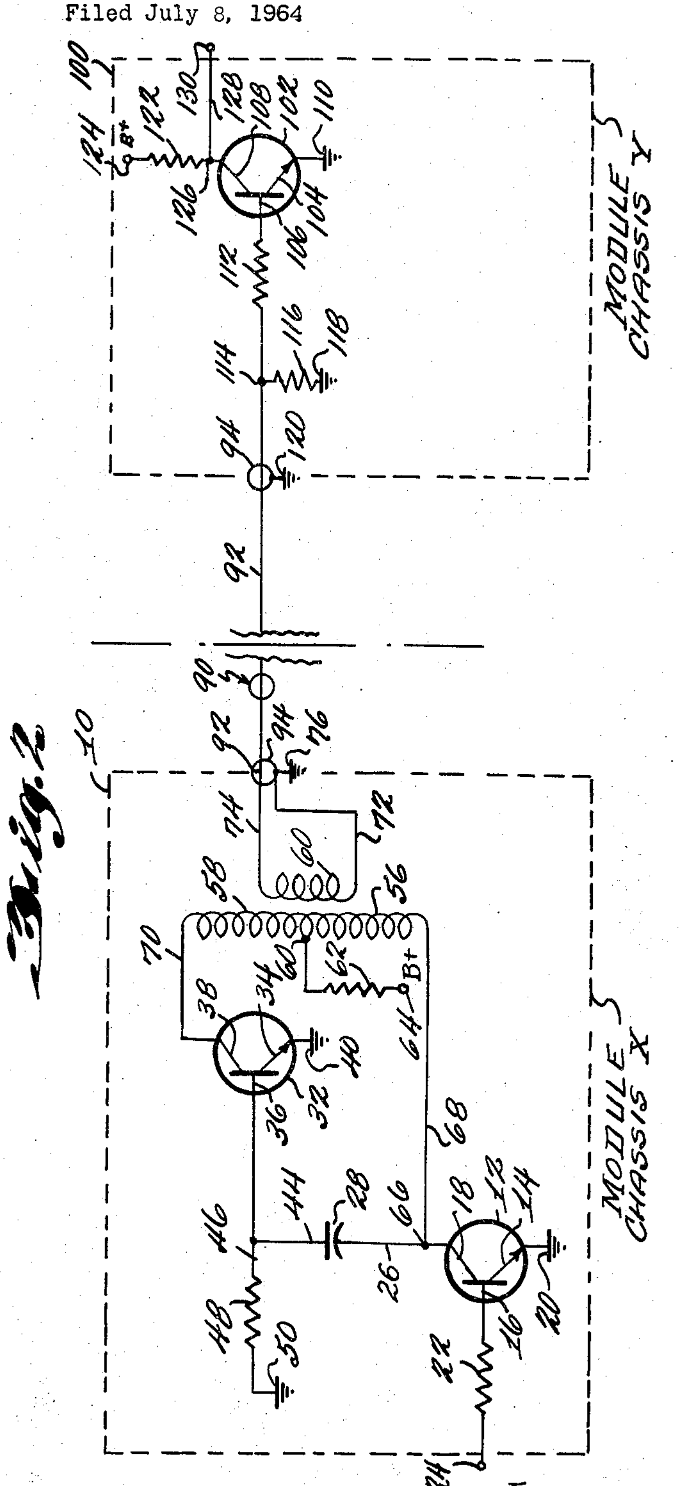
FIGURE 2 is a schematic diagram illustrating the coaxial cable transmission system including a coaxial cable transmission line, driver transistors, and receiver transistor, the driver and receiver each located on a separate chassis.

FIGURE 2 shows the above coaxial cable transmission system in detail. Module 10 contains the transistor driver circuit which is located on chassis X. The transistor driver circuit includes two NPN transistors 12 and 32. Transistor 12 has an emitter 14, a base 16 and a collector 18. The transistor 12 is connected as a grounded emitter amplifier having its emitter 14 connected to ground at 20. The base 16 is connected to one end of a base resistance 22. The other end of base resistance 22 is connected to an input terminal 24 upon which a control signal is applied.

The collector 18 is connected to a capacitance 28 via line 26. Also connected to collector 18 at connecting point 66 is a collector line 68. Collector line 68 is subsequently connected to transformer 54, and specifically to one half of a center tapped primary winding 56. The other half of the center tapped primary is winding 58. A center tapped point 60 is common to both center tapped primary windings 56 and 58. Center tapped point 60 is also connected to one end of a limiting resistance 62. The other end of limiting resistance 62 is connected to +B supply voltage 64.

Transistor 32 has an emitter 34, a base 36 and a collector 38. Transistor 32 is connected as a grounded emitter amplifier having its emitter 34 connected to ground at 40. The base 36 is connected to one end of a base resistance 48 via line 46. The other end of base resistance 48 is connected to ground at 50. Also connected to base 36 via line 44 is the capacitance 28. Capacitance 28 essentially connects the collector 18 of transistor 12 to the base 36 of transistor 32. Collector 38 of transistor 32 is connected via collector line 70 to one half the primary winding 58 of transformer 54.

Transformer 54 has a secondary winding 60. The secondary winding 60 is directly connected to the coaxial cable 90. The coaxial cable 90 has a central conductor 92 and a separate outer concentric conductor 94 surrounding conductor 92. One end of secondary 60 is connected via line 74 to conductor 92 of coaxial cable 90. The other end of secondary 60 is connected to the outer conductor 94 of coaxial cable 90. Further, the outer conductor 94 is connected to ground at 76.

Module 100, located on a separate chassis Y, is the termination of coaxial cable 90. Module 100 has a transistor 102 having an emitter 104, base 106 and a collector 108. Transistor 102 is connected as a grounded emitter amplifier with its emitter connected to ground at 110. The base 106 is connected to one end of base resistance 112. The other end of base resistance 112 is connected to the conductor 92 of coaxial cable 90. The outer conductor 94 is also grounded at the module 100 end at 120. Also connected to the base resistance 112 and the conductor 92 connection is a terminating resistance 116. One end of terminating resistance 116 is connected to the base resistance 112 at connecting point 114. The other end of terminating resistance 116 is connected to ground at 118. The terminating resistance 116 terminates the coaxial cable transmission in slightly less than its characteristic impedance. The collector 108 of transistor 102 is connected to one end of a collector resistance 122. The other end of collector resistance 122 is connected to a +B supply voltage 124. Also connected to collector 108 at point 126 is an output line 128. Output line 128 is connected to an output terminal 130 upon which an output signal will appear.

The transistors utilized in the above embodiment have the characteristics as set forth in Table A hereinbelow and are of the type as shown in Table B hereinbelow. The transistor will have two stable voltage output levels: the first when the transistor is in saturation; and the second when the transistor conduction is cut off. A transistor of this type may be generally referred to as a bilevel amplifier having a first and a second stable output voltage level. The voltage $V_B$ is the voltage applied to the input of the transistor amplifier. $V_C$ is the voltage between the collector and emitter which results when $V_B$ is applied to the input.

TABLE A

| State | $V_B$, v. | $V_C$, v. | $I_B$, ma. | $I_C$, ma. | |
|---|---|---|---|---|---|
| Cutoff | .2 | 1.2 | 0 | 0 | Average Switching Time, |
| Saturation | 1.2 | .2 | 1 | 10 | Five Nanoseconds. |

The value of components in a typical embodiment are set forth in Table B hereinbelow.

| Element: | Value or type |
|---|---|
| Transistor 12 | Fairchild 1321A. |
| Transistor 32 | Fairchild 1321A. |
| Transistor 102 | Fairchild 1321A. |
| Resistance 22, 62, 112 | 150 ohms. |
| Resistance 48 | 330 ohms. |
| Capacitance 28 | 22 picofarads. |
| Transformer 54 | 2 to 1 turns ratio. |
| Resistance 116 | 68 ohms. |
| Resistance 122 | 470 ohms. |
| Coaxial cable impedance 90 | 75 ohms. |
| Line delay of coaxial cable | 1.5 nanoseconds/ foot. |
| +B Supply voltage | 6 volts. |

For purposes of example only, the above embodiment's operation will be explained using the component values set forth in Tables A and B.

Initially, operation of the circuit is commenced with a control signal pulse having a voltage of +.2 volt applied to the input terminal 24. The +.2 volt applied to the base 16 drives the transistor 12 into cutoff. Thus, the collector 18 of transistor 12 rises to the +B supply voltage 64 of +6 volts. The +B supply voltage 64 is applied to collector 18 via limiting resistance 62, primary winding 56 and collector line 68. Thus, no current will flow in primary winding 56.

Similarly, collector 38 of transistor 32 will be at the +B supply voltage 64 of +6 volts. The +B supply voltage 64 is applied to collector 38 of transistor 32 via limiting resistance 62, primary winding 58 and collector line 70. The voltage of collector 18 of transistor 12 will be applied to capacitance 28. Capacitance 28 will isolate the base 36 of transistor 32 resulting in transistor 32 being cut off. Since transistor 32 is not conducting, current will not flow in primary winding 58.

Summarizing, the collector voltage of collector 18 of transistor 12 is initially at a +6 volts and the control signal voltage is a +.2 volt. Thus, transistor 12 is cut off. Transistor 12 may be generally described as a first bilevel amplifier driver. When transistor 12 is in this state (cutoff), the level of the output voltage shall be referred to as the first amplifier driver first output level.

It is apparent that the voltage of the first amplifier driver first output level is greater than the control signal.

Transistor 32 may be generally referred to as the second bilevel amplifier driver. When base 36 of transistor 32 is at a +.2 volt level and the collector 38 is at the +6 volt level, the transistor is cut off. When transistor 32 is in this state (cutoff), the level of the output voltage shall be referred to as the second amplifier first output level.

Considering now the termination of the coaxial cable 90 within module 100. Since the center tapped primary windings 56 and 58 of transformer 54 do not have a current flowing therethrough, secondary winding 60 will not have an output voltage appearing thereon. Further, coaxial cable 90 will not pass a voltage signal pulse to either base resistance 112 or terminating resistance 116. However, base 106 of transistor 102 will be connected via base resistance 112 and terminating resistance 116 to ground terminal 118. The voltage at point 114 would be a +.2 volt because of the circuit's physical configuration, keeping the transistor 102 cut off. While transistor 102 is cut off, the collector 108, output line 128 and output terminal 130 would tend to rise to +6 volts. However, the output terminal is connected to the input of another transistor amplifier (not shown) having a base resistance such that the output voltage is held at a +1.2 volt level.

Transistor 102 may generally be described as a bilevel amplifier receiver. When the bilevel amplifier receiver is in this state (cutoff), the level of the output voltage shall be referred to as the amplifier receiver first output level.

When the control signal pulse which is applied to input terminal 24 is changed from +.2 volt to a +1.2 volts, the driving circuit of module 10 (chassis X), including transistors 12 and 32, will respond by driving a voltage signal pulse on the coaxial cable transmission line 90 to change the output level of the bilevel receiver in module 100 (chassis Y). Further, the pulse of the signal would be of a width of approximately 25 nanoseconds. At the end of 25 nanoseconds, the control signal pulse applied to input terminal 24 will be returned to +.2 volt by the external circuit which provides the control signal.

Assume that a +1.2 volt control signal is applied to input terminal 24. The +1.2 volts will be applied to the base 16 of transistor 12 via base resistance 22. A +1.2 volts applied to the base 16 will drive transistor 12 into saturation, causing current to flow. Current will flow from the +B supply voltage 64, through limiting resistance 62, through the center tapped primary winding 56, via collector line 68, and through the collector 18 and emitter 14 to ground 20. The output voltage of transistor 12 at this output level is +.2 volt and the voltage of the control signal applied to the base 16 is +1.2 volts.

Thus, when the first bilevel amplifier is in this state (saturation), the level of the output voltage shall be referred to as the first amplifier second output level. It is apparent that the voltage of the first amplifier second output level is less than the control signal voltage.

When transistor 12 conducts, approximately 10 ma. of current will flow through primary winding 56. The voltage and current induced into the secondary winding 60 will be approximately 1.4 volts and 10 ma. This voltage signal is then applied to coaxial cable transmission line 90 between the conductor 92 and the grounded outer conductor 94. Thereafter, the coaxial cable will transmit the voltage signal to module 100 within chassis Y. Coaxial cable transmission line 90 is terminated in approximately its characteristic impedance by terminating resistance 116. When the voltage signal is applied to terminating resistance 116, the +1.4 volt signal will add to the +.2 volt level causing a current of approximately 20 ma. to flow through terminating resistance 116. The current through the base resistance 112, base 106, emitter 104 and ground 110 will be approximately 3 ma. Thus, a voltage of approximately 1.15 volts (1.6 v. −3 ma.×150) will be applied to base 106 of transistor 102. This voltage exceeds the threshold of transistor 102 and drives it into saturation causing current to flow. The current will flow from the +B supply voltage 124, through collector resistance 122, through collector 108 and emitter 104 to ground 110. The voltage of the output level is the voltage on collector 108 and will be a +.2 volt. Output terminal 130 and output line 128 will be at a +.2 volt and will apply this voltage to subsequent circuits (not shown). The total voltage signal appearing on base resistance 112 is a +1.6 volts and the voltage of the output level of the transistor is +.2 volt.

When the bilevel amplifier receiver is in this state (saturation), the level of the output voltage shall be referred to as the amplifier receiver second output level. It is apparent that the voltage of the amplifier receiver second output level is less than the voltage signal.

Refer again to module 10 on chassis X. During the time that transistor 12 is conducting, the collector voltage on collector 18 was dropped from approximately 6 volts, the +B supply voltage, to +.2 volt. The voltage charge on capacitance 28 will discharge through the collector-emitter path of transistor 12, through the ground path connected by points 20 and 50, and through resistance 48 to the other side of the capacitance. This discharge path is limited only by the collector-emitter impedance of transistor 12 and the resistance 48, and the capacitance 28 will therefore discharge very rapidly to the point where there is substantially no voltage charge on the capacitance. The capacitance remains in this discharge state until the control signal at input 24 of transistor 12 is changed back to +0.2 volt. In the embodiment described herein the control signal changes back to +0.2 volt 25 nanoseconds after having gone to +1.2 volts. When this occurs, transistor 12 becomes cut off and the voltage at collector 18 and point 66 moves rapidly toward the B+ supply value. This rapid positive-going voltage change is coupled to the base 36 of transistor 32 by capacitance 28, causing transistor 32 to begin conducting. Transistor 32 will continue conducting until capacitance 28 again charges up to approximately the B+ voltage which is present at point 66. Capacitance 28, base resistance 48, limiting resistance 62 and the impedance of primary winding 56 determines the length of time that transistor 32 will conduct. When capacitance 28 has again become fully charged, current will cease flowing through line 26, capacitance 28, and line 44, and transistor 32 will no longer have the base current necessary to maintain conduction and will therefore turn off. In this embodiment, transistor 32 will conduct about 25 nanoseconds after transistor 12 has been turned off. When transistor 32 conducts, current will flow from the +B supply voltage 64, through limiting resistance 62, through the other one half primary winding 58, through collector line 70, through the collector 38 and emitter 34 to ground 40. The current in primary winding 58 will produce a signal in the secondary winding 60 which is equal to, but out of phase with the transistor 12 voltage signal and lags the voltage signal by 25 nanoseconds. Thus, the effect of the transistor 32 is to provide an equal and opposite magnetizing force in the transformer for each desired control signal pulse. It is this action that prevents the transformer from building up a bias magnetization which could occur under high switching rates. When the second bilevel amplifier driver is in this state (conduction), the level of the output voltage shall be referred to as the second amplifier second output level.

If the control signal voltage remains back at its original state of +.2 volts, the driver transistors 12 and 32 will both cease conducting and the circuit will stabilize. Further, transistor 102 of module 100 would be driven back into cutoff due to the absence of voltage signal pulse.

The coaxial cable used was selected to have a time delay of 1.5 nanoseconds per foot and have a characteristic impedance of 75 ohms. Further, in a typical application, the coaxial cables between chassis are standardized at 10 feet to allow a predictable delay for signals between all chassis. The time required for the driving transistor to apply a voltage signal upon the coaxial cable after the control signal voltage is changed is about five nanoseconds. Thus, the transmissions between chassis are delayed a total of 20 nanoseconds for each pulse that is transmitted.

It will be understood that any appropriate bilevel amplifier driver and bilevel amplifier receiver may be utilized with the inventive coaxial cable transmission system.

The above illustrative embodiment comprises a preferred embodiment of the invention. However, this embodiment is not intended to limit the possibilities of insuring the features of the coaxial cable transmission system. The transmission system disclosed herein is an example of an arrangement in which the inventive features of this disclosure may be utilized and it will become apparent to one skilled in the art that certain modifications may be made within the spirit of the invention defined by the appended claims.

What is claimed is:

1. A coaxial cable transmission system having a driving circuit, a coaxial cable transmission line, and a receiving circuit, the invention being characterized by the driving circuit comprising:

(a) transformer having a primary and secondary winding, the secondary winding having two output terminals for connection to the coaxial cable transmission line, the primary winding having an input terminal connected to each end of the winding and a center terminal connected to the midpoint of the winding;

(b) a first amplifier driver having an input terminal for receiving control signals from a signal source and an output terminal connected to one of the transformer input terminals; and (c) a second amplifier driver having an input terminal capacitance-coupled to the first amplifier driver output terminal, and an output terminal connected to the second transformer input terminal, whereby the second amplifier driver is turned on for a predetermined time interval when the first amplifier driver switches to its off state.

2. A coaxial cable transmission system as set forth in claim 1 wherein the transformer center terminal is connected through a resistance to a power source and the transformer primary winding is arranged so that the magnetic flux induced in the transformer by current drawn by the second amplifier driver is in a sense opposite to magnetic flux induced in the transformer by current drawn by the first amplifier driver.

3. A coaxial cable transmission system as set forth in claim 1 wherein the first amplifier driver and the second amplifier driver each include means for holding the amplifier drivers substantially in their cutoff state when no control signal is present at the input terminal of the first amplifier driver.

4. A coaxial cable transmission system as set forth in claim 1 wherein the value of the capacitance which couples the first amplifier driver output to the second amplifier driver input is selected so as to provide second amplifier driver conduction for a time interval which is substantially equal to the time interval of the control signal which drives the first amplifier driver input.

5. A coaxial cable transmission system as set forth in claim 1 wherein the amplifier drivers operate normally in their cutoff state, and operate in their saturation state when a control signal is present at their input terminal.

References Cited

UNITED STATES PATENTS

| | | | |
|---|---|---|---|
| 3,140,405 | 7/1964 | Kolling | 333—12 X |
| 3,170,038 | 2/1965 | Johnson et al. | |
| 3,281,694 | 10/1966 | Clark. | |

ROY LAKE, *Primary Examiner.*

N. KAUFMAN, *Examiner.*